US011322586B2

(12) United States Patent
    Sakamoto

(10) Patent No.: US 11,322,586 B2
(45) Date of Patent: May 3, 2022

(54) SEMICONDUCTOR DEVICE

(71) Applicant: Mitsubishi Electric Corporation, Tokyo (JP)

(72) Inventor: Shunsuke Sakamoto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 26 days.

(21) Appl. No.: 16/682,299

(22) Filed: Nov. 13, 2019

(65) Prior Publication Data

US 2020/0227521 A1    Jul. 16, 2020

(30) Foreign Application Priority Data

Jan. 16, 2019  (JP) .............................. JP2019-005029

(51) Int. Cl.
    *H01L 29/739*    (2006.01)
    *H01L 29/06*     (2006.01)
    *H01L 23/00*     (2006.01)
    *H01L 29/423*    (2006.01)

(52) U.S. Cl.
    CPC ......... *H01L 29/0696* (2013.01); *H01L 24/45* (2013.01); *H01L 29/42304* (2013.01); *H01L 29/7395* (2013.01); *H01L 2924/13055* (2013.01)

(58) Field of Classification Search
    CPC ........... H01L 29/0696; H01L 29/42304; H01L 29/7395; H01L 24/45; H01L 2924/13055
    See application file for complete search history.

(56) References Cited

U.S. PATENT DOCUMENTS

2009/0289277 A1    11/2009  Yamaguchi
2012/0025263 A1*   2/2012   Yamaguchi ......... H01L 29/7395
                                              257/139
2016/0358869 A1    12/2016  Godo et al.

FOREIGN PATENT DOCUMENTS

JP    2010004003 A    1/2010
WO    2015/198435 A1  12/2015

OTHER PUBLICATIONS

An Office Action; "Notice of Reasons for Refusal," mailed by the Japanese Patent Office dated Dec. 7, 2021, which corresponds to Japanese Patent Application No. 2019-005029 and is related to U.S. Appl. No. 16/682,299 with English translation.

* cited by examiner

*Primary Examiner* — Timor Karimy
(74) *Attorney, Agent, or Firm* — Studebaker & Brackett PC

(57) ABSTRACT

A semiconductor device capable of suppressing the calorific value at the central portion of a wire bonding area is provided. A semiconductor device includes a plurality of IGBT cells in a cell area. An emitter electrode serves as a current path when a plurality of IGBT cells are in conductive state, and is formed to cover a plurality of IGBT cells. A wire is bonded to the emitter electrode. A dummy cell which does not perform a bipolar operation, is formed at least below a central portion of a wire bonding area which is an area at which the wire and the emitter electrode are bonded.

19 Claims, 8 Drawing Sheets

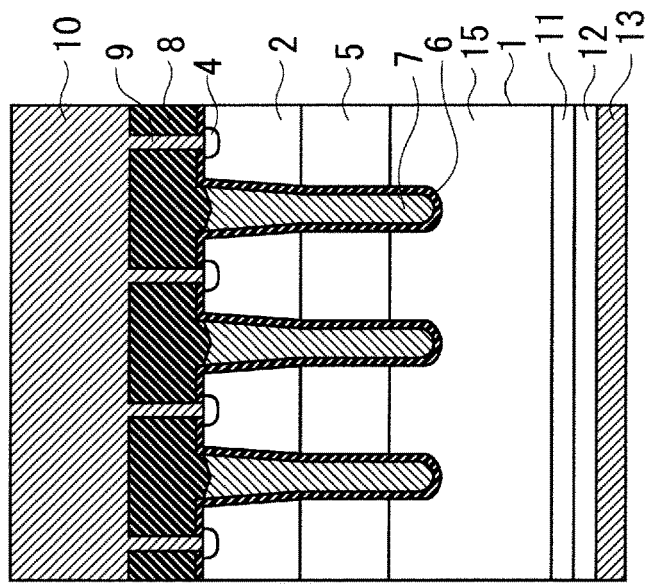
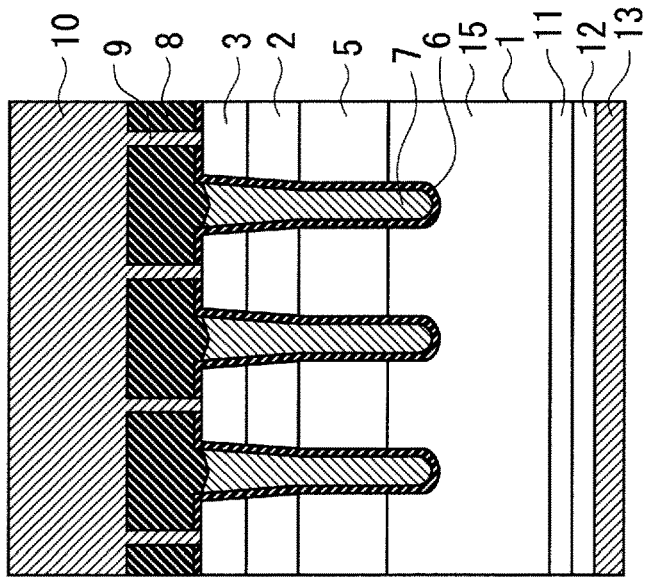
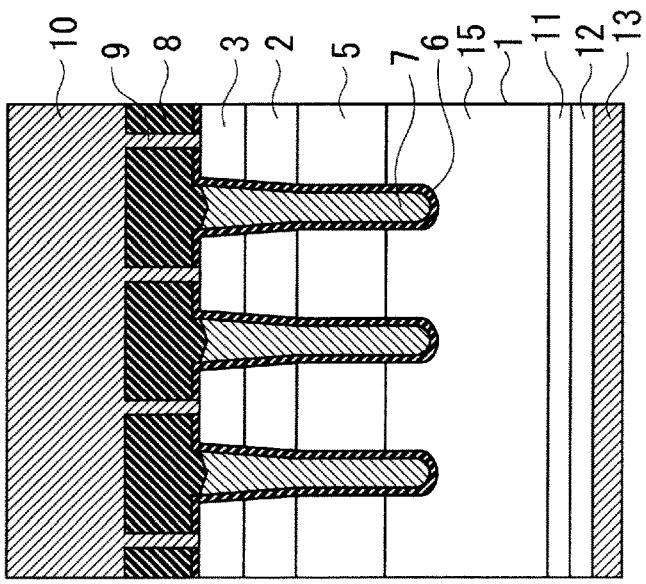

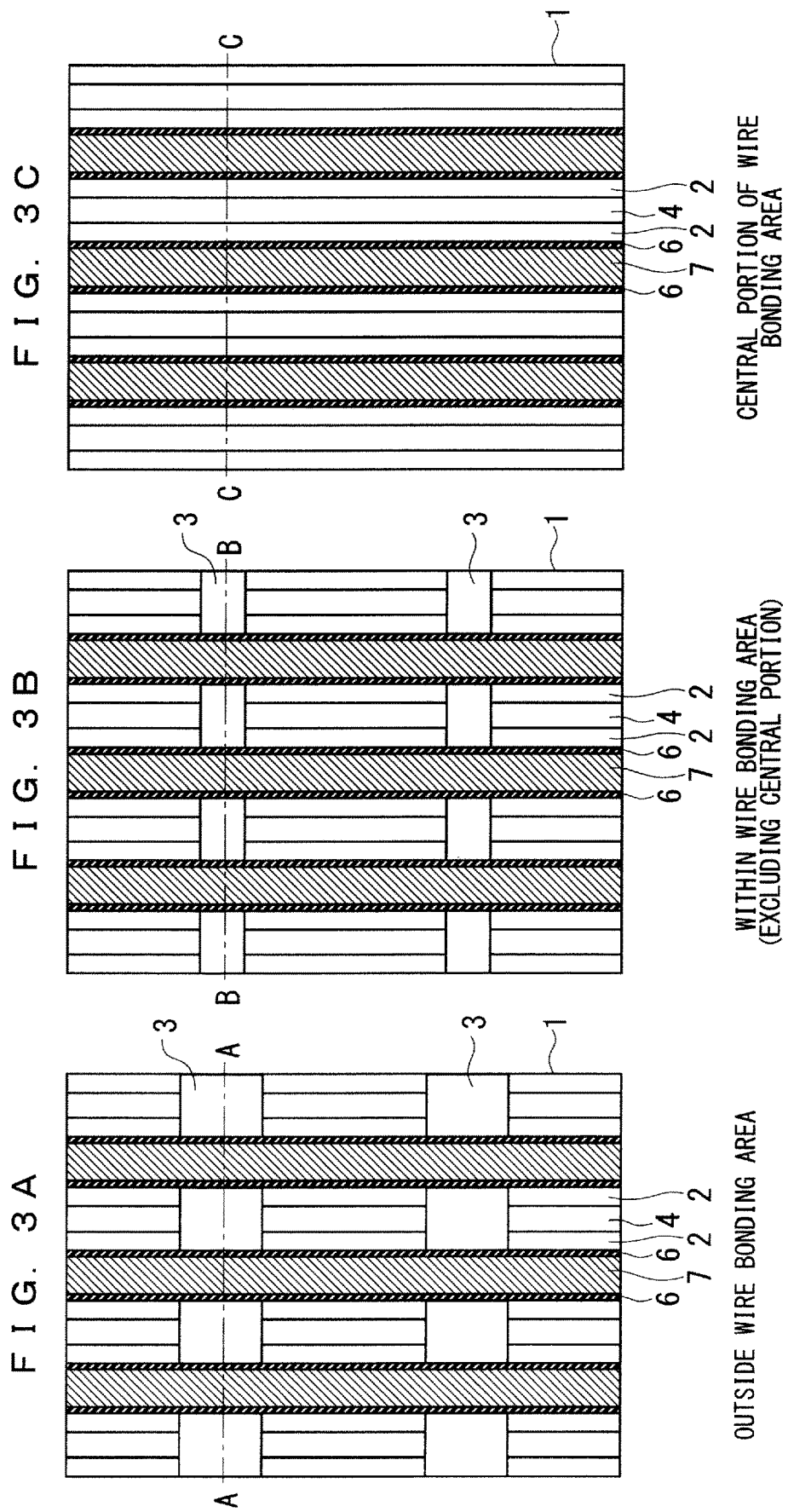

OUTSIDE WIRE BONDING AREA

WITHIN WIRE BONDING AREA (EXCLUDING CENTRAL PORTION)

CENTRAL PORTION OF WIRE BONDING AREA

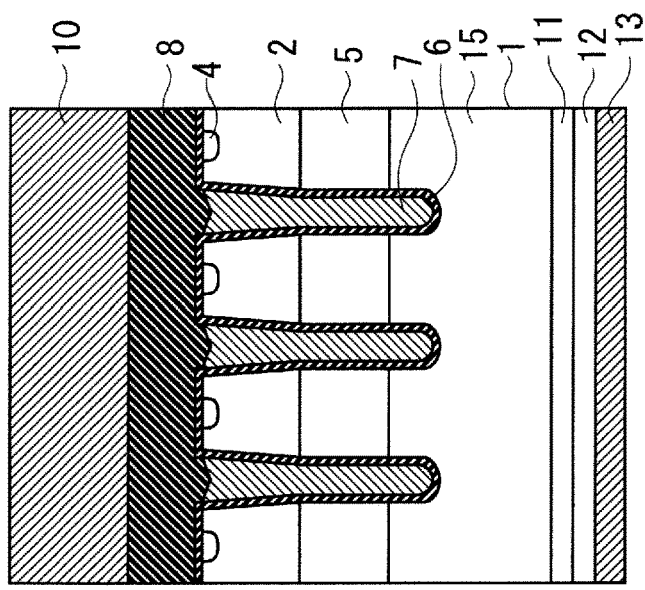
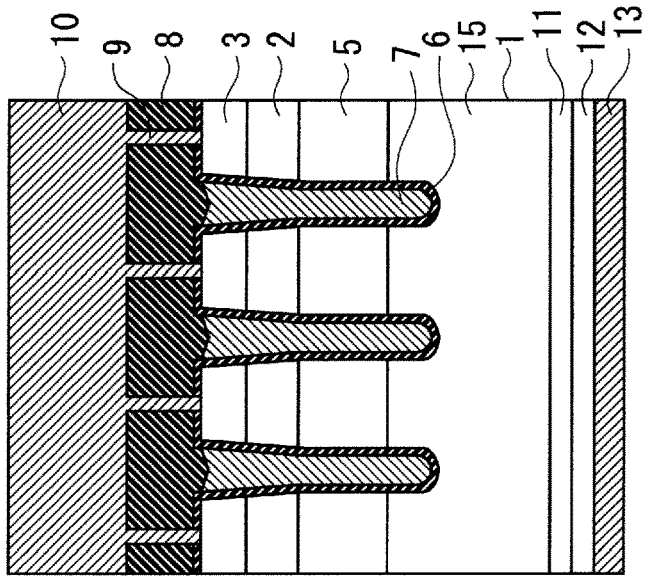
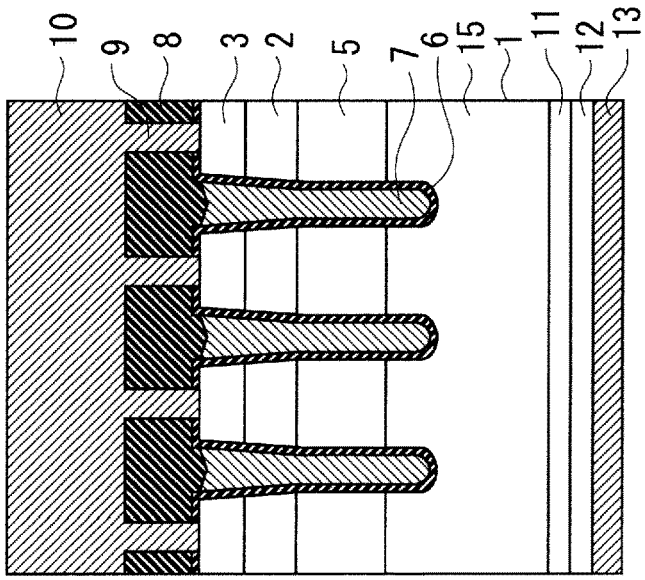

F I G. 6
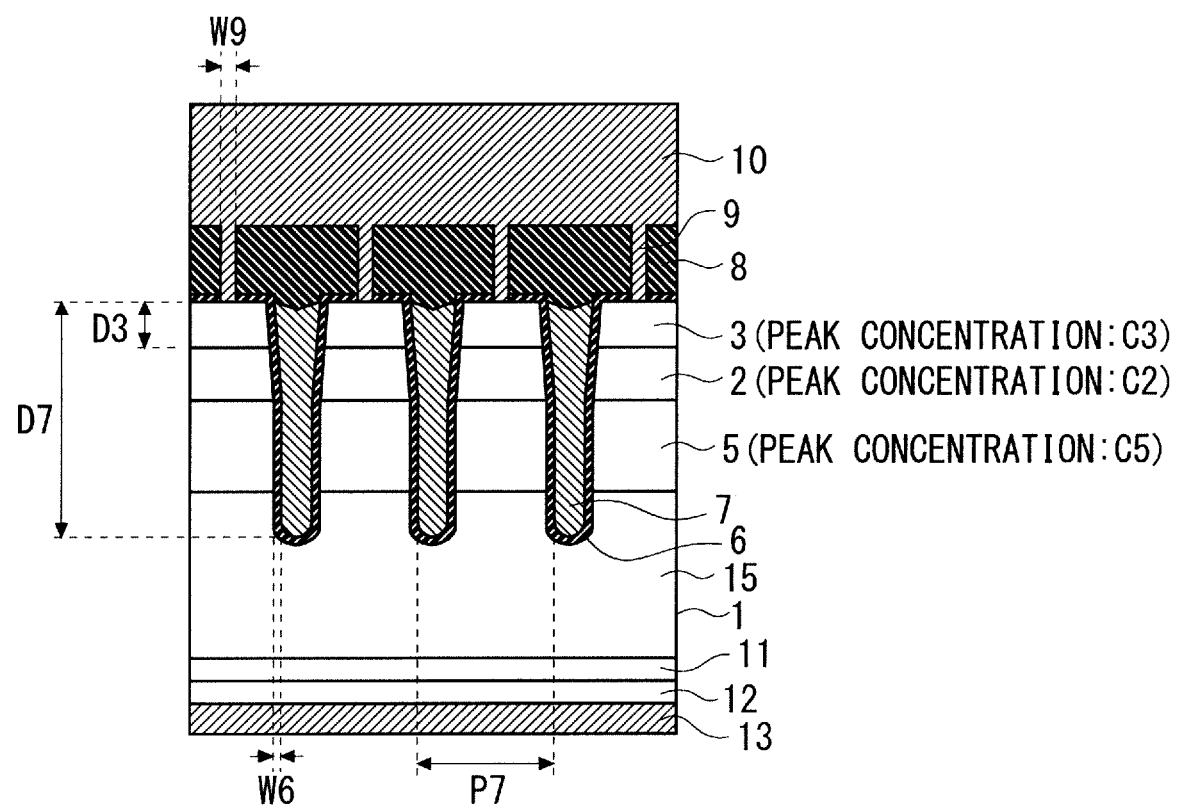

SEMICONDUCTOR DEVICE

BACKGROUND OF THE INVENTION

Field of the Invention

The present invention relates to a semiconductor device, and more particularly to a semiconductor device for power control.

Description of the Background Art

In a power module provided with a semiconductor device (power semiconductor device) for power control such as an Insulated Gate Bipolar Transistor (IGBT) or a Metal Oxide Semiconductor Field Effect Transistor (MOSFET), connection between an electrode formed on the surface of the semiconductor device (hereinafter referred to as "surface electrode") and an electrode of a package of a module is generally made by a wire made of metal such as aluminum. The area where the wire can be bonded to the surface electrode of the semiconductor device and the number of wires that can be bonded to the surface electrode of the semiconductor device are limited by the constraints or the like of assembly equipment; therefore, the area where the wire is bonded to the surface electrode (hereinafter referred to as "wire bonding area") is local. Accordingly, a current flowing through cells located below the wire bonding area flows directly into the wire; however, a current flowing through the cells located outside the wire bonding area flows laterally through the surface electrode and flows into the wire. Therefore, the current inevitably concentrates in the vicinity of the wire bonding area, and the calorific value of that portion becomes maximized in the plane of the chip of the semiconductor device. Therefore, the temperature of the wire bonding area is a factor that determines the short circuit safe operating area (SCSOA) of the semiconductor device.

The following Japanese Patent Application Laid-Open No. 2010-004003 discloses a technique in which, the current-carrying capacity of the cells located immediately below the wire bonding area is lowered lower than the current-carrying capacity of the other cells not located immediately below the wire bonding area; thereby, reducing the calorific value in the wire bonding area and suppressing peeling and breakage of a wire caused by a temperature change to improve the life of the semiconductor device.

In the technique of Japanese Patent Application Laid-Open No. 2010-004003, the calorific value in the wire bonding area can be suppressed, which contributes to improvement of SCSOA. However, the current flowing through the semiconductor device tends to be concentrated particularly in the central portion of the wire bonding area; therefore, for further improvement of SCSOA, a technique for suppressing the calorific value at the central portion of the wire bonding area is desired.

SUMMARY

An object of the present invention is to provide a semiconductor device capable of suppressing the calorific value at the central portion of a wire bonding area.

The semiconductor device includes a plurality of transistor cells formed in a semiconductor layer. A current electrode serving as a current path when the plurality of transistor cells are in a conductive state is formed to cover the plurality of transistor cells and a wire is bonded to the current electrode. In the semiconductor layer, a dummy cell which does not perform a bipolar operation, is formed at least below a central portion of a wire bonding area which is an area at which the wire and the current electrode are bonded.

According to the present invention, since the cells below the central portion of the wire bonding area do not perform the bipolar operation, the calorific value of the central portion of the wire bonding area can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A to 2C are cross-sectional views illustrating a cell area of the semiconductor device according to Embodiment 1;

FIGS. 3A to 3C are top views illustrating the cell area of the semiconductor device according to Embodiment 1;

FIGS. 5A to 5C are cross-sectional views illustrating a cell area of a semiconductor device according to Embodiment 3;

FIG. 6 is a diagram illustrating parameters for setting the current-carrying capacity of an IGBT cell in Embodiment 4;

DESCRIPTION OF THE PREFERRED EMBODIMENTS

Hereinafter, a semiconductor device according to Embodiments of the present invention will be described. In each Embodiment, a trench gate type IGBT is shown as an example of the semiconductor device. However, the semiconductor device is not limited to the IGBT, and may be, for example, a MOSFET, a Reverse-Conducting IGBT (RC-IGBT) in which a Free Wheeling Diode (FWD) is built in an IGBT, or the like. Further, the structure of a gate electrode of the semiconductor device is not limited to the trench gate type, and may be a plane gate type. Further, in addition to generally used Si (silicon), materials of the semiconductor device may include, for example, a wide-band-gap semiconductor made of SiC (silicon carbide), GaN (gallium nitride), or the like. Also in each Embodiment, although the first conductivity type is described as N-type and the second conductivity type is described as P-type, the first conductivity type may be described as P-type and the second conductivity type may be described as N-type.

Embodiment 1

Figure 1:
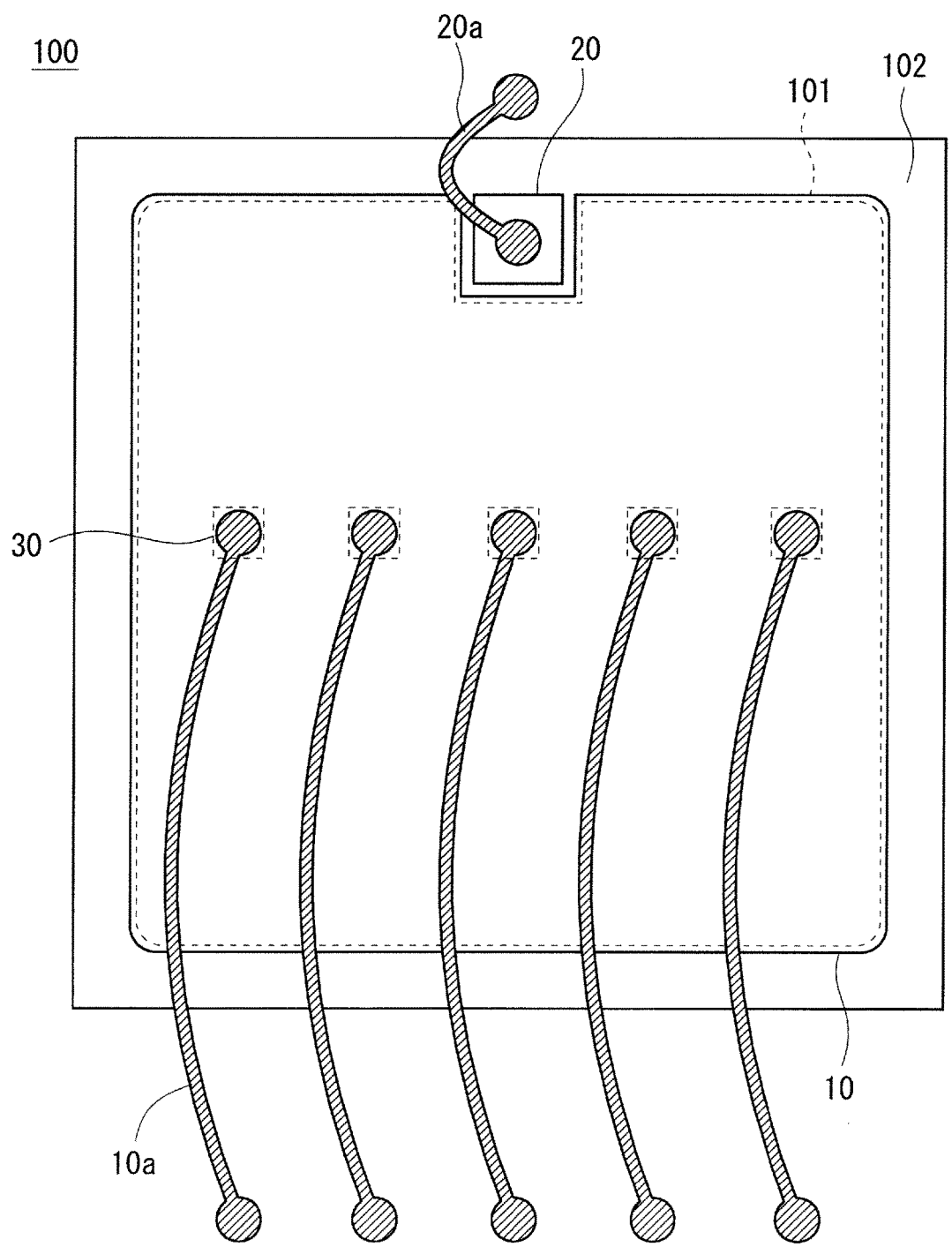
FIG. 1 is a top view illustrating a semiconductor device according to Embodiment 1.

FIG. 1 is a top view of an IGBT chip which is a semiconductor device 100 according to Embodiment 1. As illustrated in FIG. 1, the semiconductor device 100 includes a cell area 101 in which a plurality of IGBT cells as transistor cells are formed and terminal area 102 provided so as to surround the cell region 101 and in which a termination structure such as a guard ring, a Junction Termination Extension (JTE), or the like, is formed. On the upper surface of the semiconductor device 100, an emitter electrode 10 formed on the entire surface of the cell region 101 and a gate pad 20 formed on a part of the terminal area 102 are formed as surface electrodes.

The emitter electrode 10 is formed so as to cover a plurality of IGBT cells in the cell region 101, and is a current electrode serving as a current path when the plurality of IGBT cells are in the conductive state. The gate pad 20 is connected to gate electrodes of a plurality of IGBT cells in the cell area 101, and is a control electrode for inputting a control signal for switching on (conductive) and off (non-conductive) of the plurality of IGBT cells.

Wires 10a are bonded to the emitter electrode 10, and the emitter electrode 10 is connected to an external electrode (for example, an electrode of a package of a power module) via the wires 10a. Further, a wire 20a is bonded to the gate pad 20, and the gate pad 20 is connected to an external electrode via the wire 20a. The wires 10a connected to the emitter electrode 10 serves as current paths when the plurality of IGBT cells are in the conductive state. Hereinafter, an area 30 of a certain area including a junction with the wire 10a in the emitter electrode 10 is referred to as a "wire bonding area". In Embodiment 1, an area within a rectangle surrounding the junction of the emitter electrode 10 and the wire 10a is defined as the wire bonding area 30.

FIGS. 2A to 2C are cross-sectional views illustrating the cell area 101 of the semiconductor device 100. FIGS. 3A to 3C are top views illustrating the cell area 101 of the semiconductor device 100. In FIGS. 3A to 3C, the components (such as the emitter electrode 10 shown in FIG. 1) formed on the semiconductor layer are not illustrated.

FIGS. 2A and 3A illustrate the structure of the cell area 101 outside the wire bonding area 30, and FIG. 2A corresponds to the cross section along line A-A of FIG. 3A. FIGS. 2B and 3B illustrate the structure of the cell area 101 inside the wire bonding area 30, that is, below the wire bonding area 30, and FIG. 2B corresponds to the cross section along the B-B line of FIG. 3B. It should be noted that, FIG. 2B and FIG. 3B do not include the central portion of the wire bonding area 30. FIGS. 2C and 3C illustrate the structure of the cell area 101 below the central portion of the wire bonding area 30, and FIG. 2C corresponds to the cross section along the C-C line of FIG. 3C.

As illustrated in FIGS. 2A and 3A, a plurality of IGBT cells are formed outside the wire bonding area 30. An IGBT cell is formed using a semiconductor substrate 1 which is an N-type semiconductor layer. Here, a surface on the upper side (emitter side) and a surface on the lower side (collector side) of the semiconductor substrate 1 in each cross-sectional view are defined as the "upper surface" and the lower surface, respectively.

A P-type base layer 2 is formed in the surface portion on the upper surface side of the semiconductor substrate 1. Further, on the surface portion of the base layer 2, an N+-type emitter layer 3 having a higher impurity peak concentration than that of the semiconductor substrate 1 and a P+-type contact layer 4 (not illustrated in the cross section in FIG. 2A) having a higher impurity peak concentration than that of the base layer 2 are formed. Also, an N-type charge storage layer 5 is formed under the base layer 2. Here, the N−-type region remaining under the charge storage layer 5 in the semiconductor substrate 1 is referred to as "drift layer 15".

A plurality of trenches are periodically formed on the upper surface side of the semiconductor substrate 1, and a gate insulating film 6 made of silicon oxide, for example, is formed on the semiconductor substrate 1 including the inner wall of each trench. A gate electrode 7 is formed on the gate insulating film 6 so as to fill each trench. That is, the gate insulating film 6 insulates between the gate electrode 7 and the semiconductor substrate 1.

The gate electrode 7 is adjacent to the base layer 2, the emitter layer 3 and the charge storage layer 5 via the gate insulating film 6. Also, in Embodiment 1, the bottom of the gate electrode 7 reaches the drift layer 15.

An interlayer insulating film 8 is formed on the upper surface of the semiconductor substrate 1 so as to cover the gate electrode 7. The emitter electrode 10 illustrated in FIG. 1 is formed on the interlayer insulating film 8. In the interlayer insulating film 8, contact holes 9 reaching the emitter layer 3 and the contact layer 4 are formed, and the emitter electrode 10 is connected to the emitter layer 3 and the contact layer 4 through the contact holes 9. That is, the contact holes 9 are a contact structure for connecting the emitter layer 3 and the emitter electrode 10. The gate pad 20 illustrated in FIG. 1 is connected to the gate electrode 7 in a region not shown.

A P+-type collector layer 12 is formed in the surface portion on the lower surface side of the semiconductor substrate 1. Above the collector layer 12, that is, between the drift layer 15 and the collector layer 12, an N+-type buffer layer 11 having a higher impurity peak concentration than that of the drift layer 15 is formed. A collector electrode 13 connected to the collector layer 12 is formed on the lower surface of the semiconductor substrate 1.

When a voltage higher than a threshold voltage is applied to the gate electrode 7 in a state where a forward bias is applied between the collector electrode 13 and the emitter electrode 10, a channel is formed in a portion of the base layer 2 adjacent to the gate electrode 7, and the IGBT cell becomes the conductive state (on state). At the time of conduction of the IGBT cell, the current flowing from the collector electrode 13 to the IGBT cell flows through the collector layer 12, the buffer layer 11, the drift layer 15, the charge storage layer 5, the channel formed in the base layer 2, the emitter layer 3, and the contact holes 9 to the emitter electrode 10. That is, the emitter layer 3 is a first impurity diffusion layer of the first conductivity type (N type) which is formed on the surface portion of the semiconductor layer and serves as a current path when the IGBT cell is conductive. And the base layer 2 is a second impurity diffusion layer of the second conductivity type (P type) in which a channel serving as a current path is formed adjacent to the gate electrode 7 via the gate insulating film 6 and when the IGBT cell is conductive.

As illustrated in FIGS. 2B and 3B, a plurality of IGBT cells are also formed below the wire bonding area 30 excluding the central portion of the wire bonding area 30. The structure of the IGBT cell below the wire bonding area 30 is basically the same as the IGBT cell outside the wire bonding area 30. However, as can be seen by comparing FIG. 3A with FIG. 3B, the width of the emitter layer 3 (first impurity diffusion layer) of the IGBT cell below the wire bonding area 30 is, in plan view, narrower than the width of the emitter layer 3 of the IGBT cell outside the wire bonding area 30. Therefore, the current-carrying capacity of the IGBT cell below the wire bonding area 30 is lower than the current-carrying capacity of the IGBT cell outside the wire bonding area 30.

Note that, in the present specification, the "current-carrying capacity of the IGBT cell" means the current-carrying capacity per unit area. The current-carrying capacity per unit area is a concept corresponding to the current density of the IGBT cell. In Embodiment 1, while maintaining the pitch of the IGBT cells constant, the current-carrying capacity of the IGBT cell below the wire bonding area 30 is lowered by narrowing the width of the emitter layer 3 of each IGBT cell located below the wire bonding area 30 to lower the current-carrying capacity. However, for example, even when the pitch of the IGBT cells below the wire bonding area 30 is increased while maintaining the current-carrying capacity of each IGBT cells constant, the current-carrying capacity of the IGBT cells below the wire bonding area 30 is lowered (Embodiment 2 described later corresponds to this).

Meanwhile, as illustrated in FIG. 2C and FIG. 3C, the emitter layer 3 serving as a current path is not formed in a cell below the central portion of the wire bonding area 30. Accordingly, the cells below the central portion of the wire bonding area 30 is cells which do not perform the bipolar operation (hereinafter referred to as a "dummy cell").

A general IGBT is composed of an N-channel MOSFET and a PNP transistor (or a P channel MOSFET and an NPN transistor). For example, the IGBT cell illustrated in FIG. 3A includes an N-channel MOSFET composed of the gate electrode 7, the emitter layer 3, and the base layer 2, and a PNP transistor composed of the base layer 2, the drift layer 15 and the collector layer 12.

When a positive bias is applied to the gate electrode 7 of the IGBT cell of FIG. 3A, an N channel is formed in the base layer 2 and the N-channel MOSFET is turned on. As a result, the bipolar operation in which a current whose carrier is an electron flows from the emitter layer 3 to the drift layer 15 through the N channel, a charge is accumulated in the base (the drift layer 15) of the PNP transistor, and a current whose carrier is hole flows from the collector layer 12 is performed.

Meanwhile, the dummy cell of FIG. 3C does not include the emitter layer 3 and does not include the N-channel MOSFET. Therefore, the above-described bipolar operation is not performed in the dummy cell, and a current below the central portion of the wire bonding area 30 is suppressed.

In the semiconductor device 100 according to Embodiment 1, since the dummy cells are disposed below the central portion of the wire bonding area 30 in the cell area 101, the calorific value at the central portion of the wire bonding area 30 can be suppressed, thereby contributing to the improvement of the SCSOA.

In addition, by disposing the IGBT cells having the low current-carrying capacity below the wire bonding area 30 excluding the central portion of the wire bonding area 30, the calorific value not only in the central portion of the wire bonding area 30 but also in the periphery thereof is suppressed. Note that, since the dummy cells and the IGBT cells with the low current-carrying capacity are disposed in the wire bonding area 30, the wire bonding area 30 becomes a portion with the low current-carrying capacity locally, but the provision of IGBT cells having the high current-carrying capacity outside the wire bonding area 30 compensates for this, and the decrease in the current-carrying capacity of the entire semiconductor device 100 is suppressed.

Embodiment 2

Figure 4A:
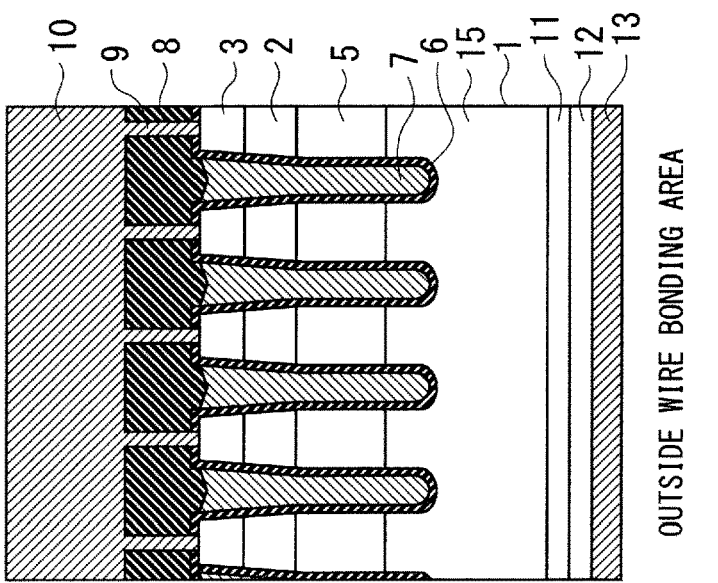
FIGS. 4A to 4C are cross-sectional views illustrating a cell area of a semiconductor device according to Embodiment 2.
Figure 4B:
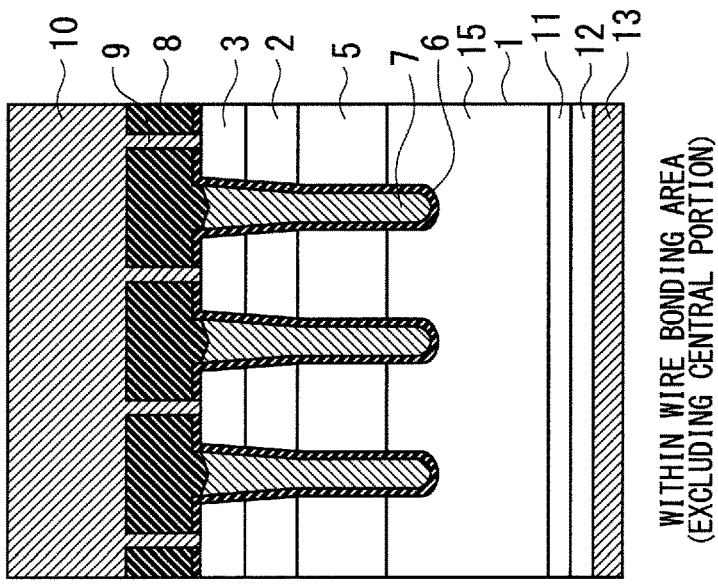
Figure 4C:
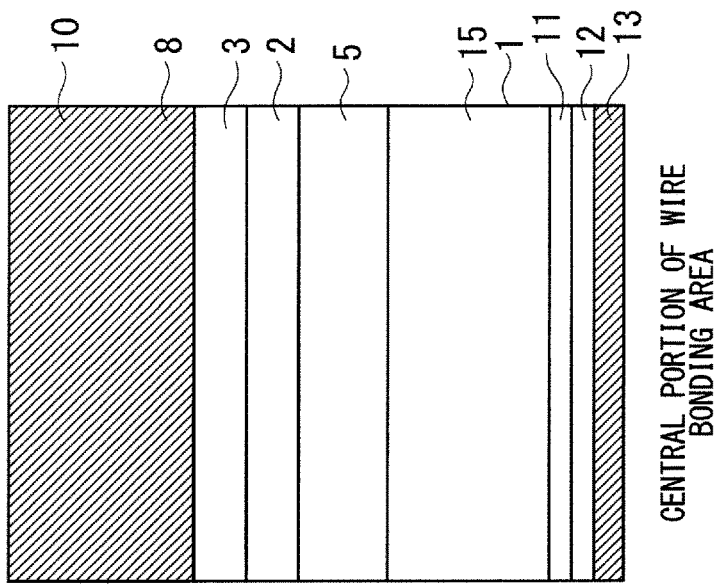

FIGS. 4A to 4C are cross-sectional views illustrating the cell area 101 of the semiconductor device 100 according to Embodiment 2. FIG. 4A illustrates a cross section of the cell area 101 outside the wire bonding area 30, FIG. 4B illustrates the cell area 101 below the wire bonding area 30 excluding the central portion of the wire bonding area 30, and FIG. 4C illustrates a cross section of the cell area 101 below the central portion of the wire bonding area 30.

As illustrated in FIGS. 4A and 4B, a plurality of IGBT cells are formed outside the wire bonding area 30 and below the wire bonding area 30 excluding the central portion of the wire bonding area 30. However, as can be seen by comparing FIG. 4A with FIG. 4B, the pitch of the gate electrode 7 in the IGBT cell below the wire bonding area 30 is longer than the pitch of the gate electrode 7 in the IGBT cell outside the wire bonding area 30. Therefore, the current-carrying capacity of the IGBT cell below the wire bonding area 30 is lower than the current-carrying capacity of the IGBT cell outside the wire bonding area 30.

Meanwhile, as illustrated in FIG. 4C, the gate electrode 7 is not formed in a cell below the central portion of the wire bonding area 30; therefore, the cell does not include an N-channel MOSFET. Therefore, a channel serving as a current path is not formed in the base layer 2 of the cell below the central portion of the wire bonding area 30. Accordingly, the cell below the central portion of the wire bonding area 30 is a dummy cell which does not perform bipolar operation.

In the semiconductor device 100 according to Embodiment 2, since the dummy cells are disposed below the central portion of the wire bonding area 30 in the cell area 101, as in the same with Embodiment 1, the calorific value at the central portion of the wire bonding area 30 can be suppressed, thereby contributing to the improvement of the SCSOA.

In addition, by disposing the IGBT cells having the low current-carrying capacity below the wire bonding area 30 excluding the central portion of the wire bonding area 30, the calorific value not only in the central portion of the wire bonding area 30 but also in the periphery thereof is suppressed. Note that, since the dummy cells and the IGBT cells with the low current-carrying capacity are disposed in the wire bonding area 30, the wire bonding area 30 becomes a portion with the low current-carrying capacity locally, but the provision of IGBT cells having the high current-carrying capacity outside the wire bonding area 30 compensates for this, and the decrease in the current-carrying capacity of the entire semiconductor device 100 is suppressed.

Embodiment 3

FIGS. 5A to 5C are cross-sectional views illustrating the cell area 101 of the semiconductor device 100 according to Embodiment 3. FIG. 5A illustrates a cross section of the cell area 101 outside the wire bonding area 30, FIG. 5B illustrates the cell area 101 below the wire bonding area 30 excluding the central portion of the wire bonding area 30, and FIG. 5C illustrates a cross section of the cell area 101 below the central portion of the wire bonding area 30.

As illustrated in FIGS. 5A and 5B, a plurality of IGBT cells are formed outside the wire bonding area 30 and below the wire bonding area 30 excluding the central portion of the wire bonding area 30. However, as can be seen by comparing FIG. 5A with FIG. 5B, the width of the contact hole 9 (contact structure) in the IGBT cell below the wire bonding area 30 is narrower than the width of the contact hole 9 in the IGBT cell outside the wire bonding area 30. Specifically, the connection area between the contact hole 9 and the emitter electrode 10 in the IGBT cell below the wire bonding area 30 is smaller than the connection area between the contact hole 9 and the emitter electrode 10 in the IGBT cell outside the wire bonding area 30. Therefore, the current-carrying capacity of the IGBT cell below the wire bonding area 30 is lower than the current-carrying capacity of the IGBT cell outside the wire bonding area 30.

Meanwhile, as illustrated in FIG. 5C, the contact hole 9 is not formed in the cell below the central portion of the wire bonding area 30. Therefore, no current flows through the cell below the central portion of the wire bonding area 30. Accordingly, the cells below the central portion of the wire bonding area 30 are the dummy cells which do not perform bipolar operation. In particular, in Embodiment 2, since the dummy cell and the emitter electrode 10 are not connected, no current flows from the dummy cell to the emitter electrode 10 as well.

In the semiconductor device 100 according to Embodiment 3, since the dummy cells are disposed below the central portion of the wire bonding area 30 in the cell area 101, as in the same with Embodiment 1, the calorific value at the central portion of the wire bonding area 30 can be suppressed, thereby contributing to the improvement of the SCSOA.

In addition, by disposing the IGBT cells having the low current-carrying capacity below the wire bonding area 30 excluding the central portion of the wire bonding area 30, the calorific value not only in the central portion of the wire bonding area 30 but also in the periphery thereof is suppressed. Note that, since the dummy cells and the IGBT cells with the low current-carrying capacity are disposed in the wire bonding area 30, the wire bonding area 30 becomes a portion with the low current-carrying capacity locally, but the provision of IGBT cells having the high current-carrying capacity outside the wire bonding area 30 compensates for this, and the decrease in the current-carrying capacity of the entire semiconductor device 100 is suppressed.

Embodiment 4

Figure 7:
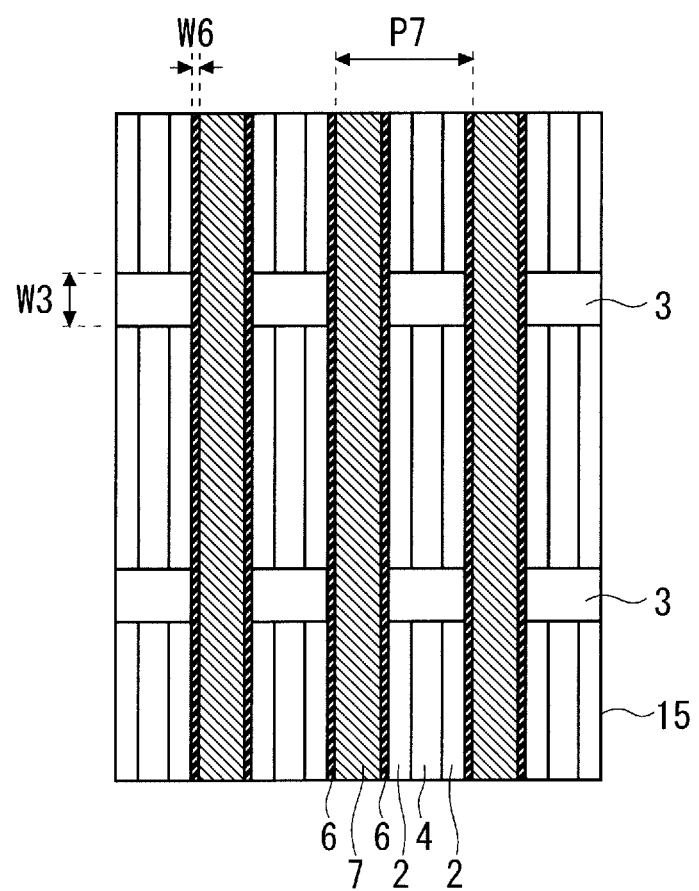
FIG. 7 is a diagram illustrating the parameters for setting the current-carrying capacity of the IGBT cell in Embodiment 4.

FIG. 6 and FIG. 7 are diagrams illustrating various parameters for setting the current-carrying capacity of the IGBT cell. FIG. 6 is a cross-sectional view of the IGBT cell, and FIG. 7 is a top view of the semiconductor layer of the IGBT cell.

In Embodiments 1 to 3, the following methods (a) to (c) are taken to lower the current-carrying capacity of the IGBT cell below the wire bonding area 30.
(a) Making the width W3 of the emitter layer 3 (first impurity diffusion layer) of the IGBT cell below the wire bonding area 30 narrower than that of the IGBT cell outside the wire bonding area 30.
(b) Making the pitch P7 of the gate electrode 7 of the IGBT cell below the wire bonding area 30 longer than that of the IGBT cell outside the wire bonding area 30.
(c) Making the width W9 of the contact hole 9 of the IGBT cell below the wire bonding area 30 narrower than that of the IGBT cell outside the wire bonding area 30.

However, the method of reducing the current-carrying capacity of the IGBT cell below the wire bonding area 30 is not limited to the methods described above, and, for example, the following methods may be adopted.
(d) Making the peak concentration C3 of the impurity in the emitter layer 3 (first impurity diffusion layer) of the IGBT cell below the wire bonding area 30 lower than that of the IGBT cell outside the wire bonding area 30.
(e) Making the peak concentration C2 of impurity in the base layer 2 (second impurity diffusion layer) of the IGBT cell below the wire bonding area 30 higher than that of the IGBT cell outside the wire bonding area 30.
(f) Making the thickness W6 of the gate insulating film of the IGBT cell below the wire bonding area 30 thicker than that of the IGBT cell outside the wire bonding area 30.
(g) Making the depth D3 of the emitter layer 3 (first impurity diffusion layer) of the IGBT cell below the wire bonding area 30 shallower than that of the IGBT cell outside the wire bonding area 30.
(h) Making the depth D7 of the trench of the gate electrode 7 of the IGBT cell below the wire bonding area 30 shallower than that of the IGBT cell outside the wire bonding area 30.
(i) Making the peak concentration C5 of the impurity of the charge storage layer 5 of the IGBT cell below the wire bonding area 30 lower than that of the IGBT cell outside the wire bonding area 30.

Furthermore, another method is as follows.
(j) Scattering the dummy cells below the wire bonding area 30 (that is, thinning the IGBT cells below the wire bonding area 30) to lower the current-carrying capacity per unit area of the IGBT cells below the wire bonding area 30. The structure of the dummy cells scattered below the wire bonding area 30 may be any of those described in Embodiments 1 to 3.

The same effects as in Embodiments 1 to 3 can be obtained by any of the above methods.

Embodiment 5

For example, it is concerned that, in the case where the ratio of the area of the wire bonding area 30 to the cell area 101 of the semiconductor device 100 is large, arranging dummy cells and IGBT cells with the low current-carrying capacity below the wire bonding area 30 possibly reduces the current-carrying capacity of the entire semiconductor device 100.

Figure 8:
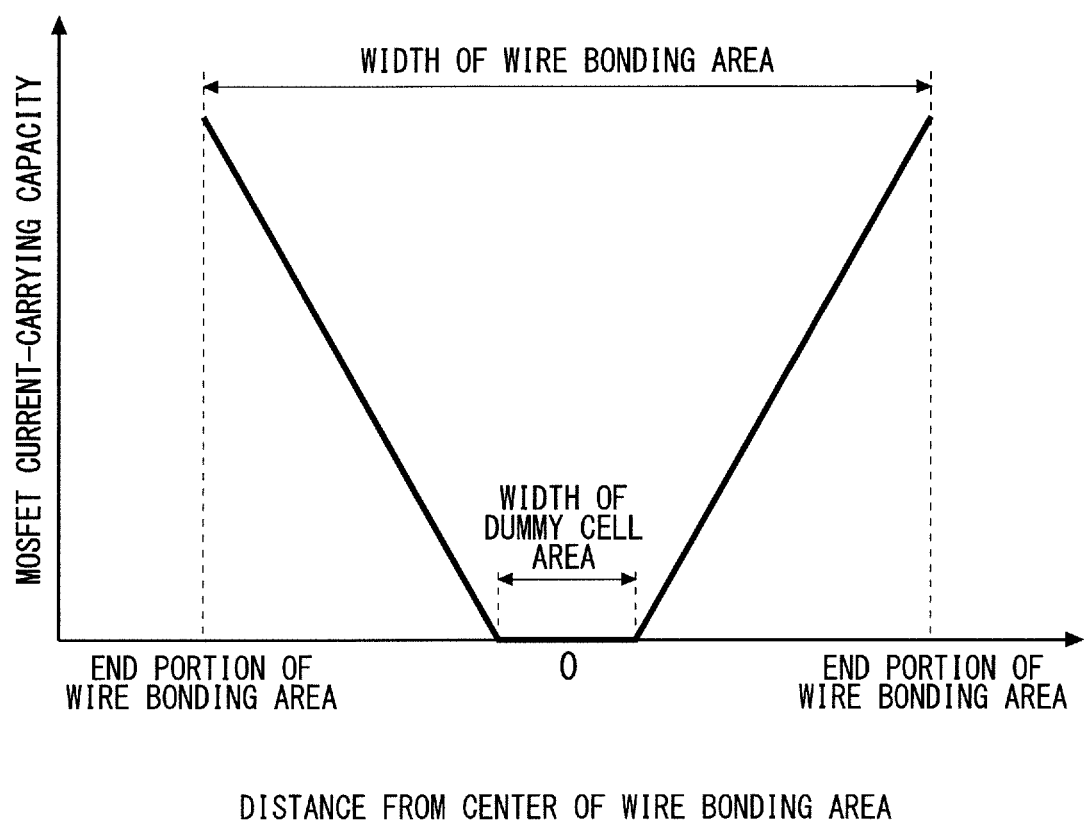
FIG. 8 is a graph illustrating an example of the relationship between a distance from the center of a wire bonding area and the MOSFET current-carrying capacity in the semiconductor device according to Embodiment 5.

Therefore, in Embodiment 5, as the graph of FIG. 8, by not providing a MOSFET having the current-carrying capacity in the cell (dummy cell) in the central portion of the wire bonding area 30, the bipolar operation of the cell is not performed, further, by raising the current-carrying capacity of the MOSFET in the IGBT cell gradually from the center of the wire bonding area 30 to the outside, the current-carrying capacity of the IGBT cell is gradually raised from the center of the wire bonding area 30 to the outside. Thereby, the current density of the wire bonding area 30 can be graded so that the density of current gradually increases from the center of the wire bonding area 30 to the outside. As a result, the decrease in the current-carrying capacity of the entire semiconductor device 100 can be suppressed, while suppressing the calorific value in the vicinity of the central portion of the wire bonding area 30.

In Embodiment 5, dummy cells are arranged below the central portion of the wire bonding area 30 so that the current distribution of the current-carrying capacity of the MOSFET as illustrated in FIG. 8 is realized in the cells below the wire bonding area 30, and the current-carrying capacity of the MOSFET of the IGBT cells below the wire bonding area 30 is made higher as the cells closer to the outer periphery of the wire bonding area 30.

The current-carrying capacity of the MOSFET of the IGBT cell can be set using the parameters illustrated in FIG. 6 and FIG. 7 in Embodiment 4. That is, the following methods can be used in order to make the current-carrying capacity of the MOSFET of the IGBT cell below the wire bonding area 30 higher as the cells closer to the outer periphery of the wire bonding area 30.
(a) Making the width W3 of the emitter layer 3 (first impurity diffusion layer) of the IGBT cell below the wire bonding area 30 wider as the cells closer to the outer periphery of the wire bonding area 30.

(b) Making the pitch P7 of the gate electrode 7 of the IGBT cell below the wire bonding area 30 shorter as the cells closer to the outer periphery of the wire bonding area 30.

(c) Making the width W9 of the contact hole 9 (contact structure) of the IGBT cell below the wire bonding area 30 wider as the cells closer to the outer periphery of the wire bonding area 30.

(d) Making the peak concentration C2 of the impurity in the emitter layer 3 (first impurity diffusion layer) of the IGBT cell below the wire bonding area 30 higher as the cells closer to the outer periphery of the wire bonding area 30.

(e) Making the peak concentration of impurity in the base layer 2 (second impurity diffusion layer) of the IGBT cell below the wire bonding area 30 lower as the cells closer to the outer periphery of the wire bonding area 30.

(f) Making the thickness W6 of the gate insulating film of the IGBT cell below the wire bonding area 30 thinner as the cells closer to the outer periphery of the wire bonding area 30.

(g) Making the depth D3 of the emitter layer 3 (first impurity diffusion layer) of the IGBT cell below the wire bonding area 30 deeper as the cells closer to the outer periphery of the wire bonding area 30.

(h) Making the depth D7 of the trench of the gate electrode 7 of the IGBT cell below the wire bonding area 30 deeper as the cells closer to the outer periphery of the wire bonding area 30.

(i) Making the peak concentration C5 of the impurity of the charge storage layer 5 of the IGBT cell below the wire bonding area 30 higher as the cells closer to the outer periphery of the wire bonding area 30.

Furthermore, another method is as follows.

(j) Scattering the dummy cells below the wire bonding area 30 and making the ratio of the dummy cells to the IGBT cells below the wire bonding area 30 lower as the cells closer to the outer periphery of the wire bonding area 30 (that is, the IGBT cell thinning ratio is lowered as the cells closer to the outer periphery of the wire bonding area 30).

The structure of the dummy cells scattered below the wire bonding area 30 may be any of those described in Embodiments 1 to 3.

According to the semiconductor device 100 of Embodiment 5, the decrease in the current-carrying capacity of the entire semiconductor device 100 can be suppressed, while suppressing the calorific value in the vicinity of the central portion of the wire bonding area 30. In particular, it is effective when the ratio of the wire bonding area 30 to the cell area 101 of the semiconductor device 100 is large.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
    a plurality of transistor cells formed in a semiconductor layer;
    a current electrode formed to cover the plurality of transistor cells and serving as a current path when the plurality of transistor cells are in a conductive state;
    a wire bonded to the current electrode, thereby defining a wire bonding area at which the wire and the current electrode are bonded; and
    dummy cells, which do not perform a bipolar operation, formed in the semiconductor layer at least below a central portion of the wire bonding area, wherein
    each of the plurality of transistor cells includes
        a gate insulating film formed on the semiconductor layer,
        a gate electrode formed on the gate insulating film,
        a first impurity diffusion layer of a first conductivity type formed on a surface portion of the semiconductor layer and serving as the current path when the transistor cells are in a conductive state,
        a second impurity diffusion layer of a second conductivity type adjacent to the gate electrode via the gate insulating film and in which a channel serving as the current path when the transistor cells are in a conductive state is formed, and
        a contact structure through which the first impurity diffusion layer and the current electrode are connected, and
    each of the dummy cells does not include at least one of the first impurity diffusion layer, the gate electrode, and the contact structure.

2. A semiconductor device, comprising: a plurality of transistor cells formed in a semiconductor layer; a current electrode formed to cover the plurality of transistor cells and serving as a current path when the plurality of transistor cells are in a conductive state; a wire bonded to the current electrode, thereby defining a wire bonding area at which the wire and the current electrode are bonded; and dummy cells, which do not perform a bipolar operation, formed in the semiconductor layer at least below a central portion of the wire bonding area, wherein each of the plurality of transistor cells includes a gate insulating film formed on the semiconductor layer, a gate electrode formed on the gate insulating film, a first impurity diffusion layer of a first conductivity type formed on a surface portion of the semiconductor layer and serving as the current path when the transistor cells are in a conductive state, a second impurity diffusion layer of a second conductivity type adjacent to the gate electrode via the gate insulating film and in which a channel serving as the current path when the transistor cells are in a conductive state is formed, and a contact structure through which the first impurity diffusion layer and the current electrode are connected, each of the dummy cells does not include at least one of the first impurity diffusion layer, the gate electrode, and the contact structure; wherein some of the plurality of transistor cells are formed below the wire bonding area excluding the central portion of the wire bonding area, and a width of the first impurity diffusion layer of each transistor cell below the wire bonding area is narrower than a width of the first impurity diffusion layer of each transistor cell outside the wire bonding area.

3. The semiconductor device according to claim 2, wherein
    a width of the first impurity diffusion layer of each transistor cells closer to an outer periphery of the wire bonding area of the transistor cells below the wire bonding area is wider.

4. The semiconductor device according to claim 1, wherein
    some of the plurality of transistor cells are formed below the wire bonding area excluding the central portion of the wire bonding area, and a pitch of the gate electrode of each transistor cell below the wire bonding area is longer than a pitch of the gate electrode of each transistor cell outside the wire bonding area.

5. The semiconductor device according to claim 4, wherein
the pitch of the gate electrode of each transistor cell closer to an outer periphery of the wire bonding area of the transistor cells below the wire bonding area is shorter.

6. The semiconductor device according to claim 1, wherein
some of the plurality of transistor cells are formed below the wire bonding area excluding the central portion of the wire bonding area, and
a width of the contact structure of each transistor cell below the wire bonding area is narrower than a width of the contact structure of each transistor cell outside the wire bonding area.

7. The semiconductor device according to claim 6, wherein
the width of the contact structure of each transistor cell closer to an outer periphery of the wire bonding area of the transistor cells below the wire bonding area is wider.

8. The semiconductor device according to claim 1, wherein
some of the plurality of transistor cells are formed below the wire bonding area excluding the central portion of the wire bonding area, and
a peak concentration of an impurity of the first impurity diffusion layer of each transistor cell below the wire bonding area is lower than a peak concentration of an impurity of the first impurity diffusion layer of each transistor cell outside the wire bonding area.

9. The semiconductor device according to claim 8, wherein
the peak concentration of the impurity of the first impurity diffusion layer of each transistor cell closer to an outer periphery of the wire bonding area of transistor cells below the wire bonding area is higher.

10. A semiconductor device, comprising: a plurality of transistor cells formed in a semiconductor layer; a current electrode formed to cover the plurality of transistor cells and serving as a current path when the plurality of transistor cells are in a conductive state; a wire bonded to the current electrode, thereby defining a wire bonding area at which the wire and the current electrode are bonded; and dummy cells, which do not perform a bipolar operation, formed in the semiconductor layer at least below a central portion of the wire bonding area, wherein each of the plurality of transistor cells includes a gate insulating film formed on the semiconductor layer, a gate electrode formed on the gate insulating film, a first impurity diffusion layer of a first conductivity type formed on a surface portion of the semiconductor layer and serving as the current path when the transistor cells are in a conductive state, a second impurity diffusion layer of a second conductivity type adjacent to the gate electrode via the gate insulating film and in which a channel serving as the current path when the transistor cells are in a conductive state is formed, and a contact structure through which the first impurity diffusion layer and the current electrode are connected, each of the dummy cells does not include at least one of the first impurity diffusion layer, the gate electrode, and the contact structure,
some of the plurality of transistor cells are formed below the wire bonding area excluding the central portion of the wire bonding area, and
a peak concentration of an impurity of the second impurity diffusion layer of each transistor cell below the wire bonding area is higher than a peak concentration of an impurity of the second impurity diffusion layer of each transistor cell outside the wire bonding area.

11. The semiconductor device according to claim 10, wherein
a peak concentration of an impurity of the second impurity diffusion layer of each transistor cell closer to an outer periphery of the wire bonding area of transistor cells below the wire bonding area is lower.

12. A semiconductor device, comprising: a plurality of transistor cells formed in a semiconductor layer; a current electrode formed to cover the plurality of transistor cells and serving as a current path when the plurality of transistor cells are in a conductive state; a wire bonded to the current electrode, thereby defining a wire bonding area at which the wire and the current electrode are bonded; and dummy cells, which do not perform a bipolar operation, formed in the semiconductor layer at least below a central portion of the wire bonding area, wherein each of the plurality of transistor cells includes a gate insulating film formed on the semiconductor layer, a gate electrode formed on the gate insulating film, a first impurity diffusion layer of a first conductivity type formed on a surface portion of the semiconductor layer and serving as the current path when the transistor cells are in a conductive state, a second impurity diffusion layer of a second conductivity type adjacent to the gate electrode via the gate insulating film and in which a channel serving as the current path when the transistor cells are in a conductive state is formed, and a contact structure through which the first impurity diffusion layer and the current electrode are connected, each of the dummy cells does not include at least one of the first impurity diffusion layer, the gate electrode, and the contact structure,
some of the plurality of transistor cells are formed below the wire bonding area excluding the central portion of the wire bonding area, and
a thickness of the gate electrode of each transistor cell below the wire bonding area is greater than a thickness of the gate electrode of each transistor cell outside the wire bonding area.

13. The semiconductor device according to claim 12, wherein
the thickness of the gate insulating film of each transistor cell closer to an outer periphery of the wire bonding area of transistor cells below the wire bonding area is thinner.

14. The semiconductor device according to claim 1, wherein,
in each of the plurality of transistor cells, the gate electrode is filled in a trench formed in the semiconductor layer,
some of the plurality of transistor cells are formed below the wire bonding area excluding the central portion of the wire bonding area, and
a depth of the first impurity diffusion layer of each transistor cell below the wire bonding area is shallower than a depth of the first impurity diffusion layer of each transistor cells outside the wire bonding area.

15. The semiconductor device according to claim 14, wherein
the depth of the first impurity diffusion layer of each transistor cell closer to an outer periphery of the wire bonding area of transistor cells below the wire bonding area is deeper.

16. The semiconductor device according to claim 1, wherein
in each of the plurality of transistor cells, the gate electrode is filled in a trench formed in the semiconductor layer,
some of the plurality of transistor cells are formed below the wire bonding area excluding the central portion of the wire bonding area, and
a depth of the trench of the gate electrode of each transistor cell below the wire bonding area is shallower than a depth of the trench of the gate electrode of each transistor cell outside the wire bonding area.

17. The semiconductor device according to claim 16, wherein
the depth of the trench of the gate electrode of each transistor cell closer to an outer periphery of the wire bonding area of transistor cells below the wire bonding area is deeper.

18. The semiconductor device according to claim 1, wherein
each of the plurality of transistor cells further includes a charge storage layer of a first conductivity type below the second impurity diffusion layer,
some of the plurality of transistor cells are formed below the wire bonding area excluding the central portion of the wire bonding area, and
a peak concentration of an impurity of the charge storage layer of each transistor cell below the wire bonding area is lower than a peak concentration of an impurity of the charge storage layer of each transistor cell outside the wire bonding area.

19. The semiconductor device according to claim 18, wherein
the peak concentration of the impurity of the charge storage layer of each transistor cell closer to an outer periphery of the wire bonding area of transistor cells below the wire bonding area is higher.

* * * * *